(12) United States Patent
Chang

(10) Patent No.: US 9,345,152 B2
(45) Date of Patent: May 17, 2016

(54) FOAM ASSEMBLY AND METHOD FOR MANUFACTURING THE SAME, AND ELECTRONIC DEVICE USING THE FOAM ASSEMBLY

(71) Applicant: FIH (Hong Kong) Limited, Kowloon (HK)

(72) Inventor: Chih-Wei Chang, New Taipei (TW)

(73) Assignee: FIH (Hong Kong) Limited, Kowloon (HK)

( * ) Notice: Subject to any disclaimer, the term of this patent is extended or adjusted under 35 U.S.C. 154(b) by 570 days.

(21) Appl. No.: 13/726,876

(22) Filed: Dec. 26, 2012

(65) Prior Publication Data
US 2014/0055921 A1    Feb. 27, 2014

(30) Foreign Application Priority Data
Aug. 27, 2012    (CN) .......................... 2012 1 0307024

(51) Int. Cl.
*B05D 5/10* (2006.01)
*H05K 5/02* (2006.01)
*B05D 1/28* (2006.01)

(52) U.S. Cl.
CPC ................ *H05K 5/0217* (2013.01); *B05D 1/28* (2013.01); *Y10T 428/24347* (2015.01)

(58) Field of Classification Search
CPC .......................... B05D 1/28; Y10T 428/24347
USPC ................................ 427/207.1, 208; 428/140
See application file for complete search history.

(56) References Cited

U.S. PATENT DOCUMENTS

2003/0143338 A1*   7/2003   Neuhaus-Steinmetz ... B05C 1/0813
                                                              427/551

* cited by examiner

*Primary Examiner* — Xiao Zhao
(74) *Attorney, Agent, or Firm* — Novak Druce Connolly Bove + Quigg LLP

(57) ABSTRACT

A foam assembly includes a foam body, the foam body defining a plurality of through holes. The foam assembly further includes a colloid body formed by a first colloid portion formed on one of two opposing surfaces of the foam body, a second colloid portion formed on a second of two opposing surfaces of the foam body, and connecting portions extending through the through holes of the foam body from one opposing surface of the foam body to the other. A method for manufacturing the foam assembly and an electronic device using the foam assembly are also disclosed.

2 Claims, 4 Drawing Sheets

FOAM ASSEMBLY AND METHOD FOR MANUFACTURING THE SAME, AND ELECTRONIC DEVICE USING THE FOAM ASSEMBLY

BACKGROUND

1. Technical Field

The present disclosure relates to a foam assembly and a method for manufacturing the foam assembly, and electronic device using the foam assembly.

2. Description of Related Art

A foam 200 of prior art in FIG. 1 is used as a buffering and shockproof element for a window of electronic device. The foam 200 includes a foam body 210, and adhesive tapes 230 formed on opposing surface of the foam body 210. The two adhesive tapes 230 adhere respectively to a window body 250 and a cover 270. Since the foam 200 is commonly a soft material with a very fragile structure, when the foam 200 needs to be detached from the electronic device, the foam 200 is damaged very easily and pieces, which are hard to remove from the window body 250 or the cover 270, break off, making it very difficult to use the body 270 again. Additionally, the two adhesive tapes 230 are prone to shifting or sliding out of position when the foam body 210 is cut to form a desired structure, which negatively affects the cutting accuracy. Furthermore, the foam body 210 having low rigidity is easily deformed.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary foam assembly and method for manufacturing the foam assembly. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
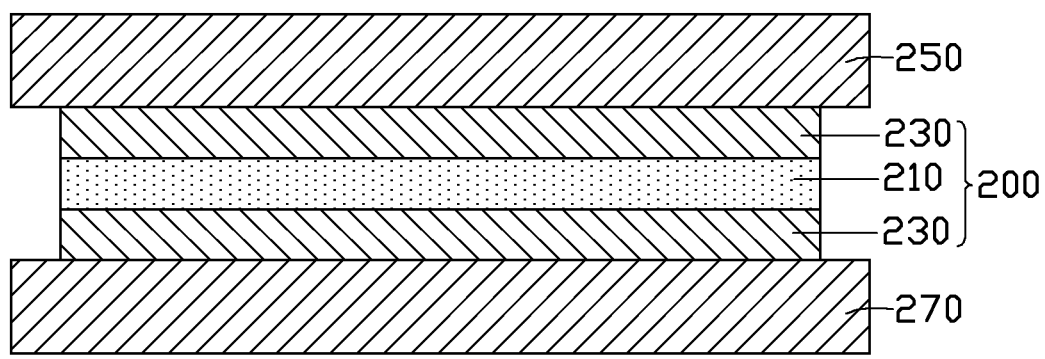
FIG. 1 is a cross-sectional view of a foam of prior art.
Figure 2:
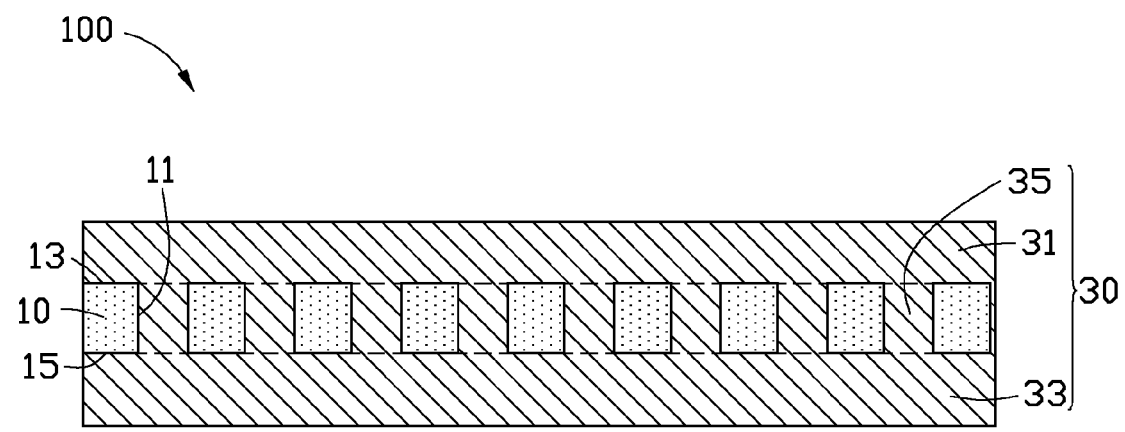
FIG. 2 is a cross-sectional view of an embodiment of a foam assembly.

FIG. 2 shows a foam assembly 100 according to an exemplary embodiment. The foam assembly 100 includes a foam body 10. The foam body 10 defines a plurality of through holes 11. The foam body 10 includes a first surface 13 and an opposing second surface 15. The foam body 10 further includes a colloid body 30 integrally formed as a first colloid layer 31, a second colloid layer 33, and a plurality of connecting bodies 35. The first colloid layer 31 is formed on one surface of the foam body 10. The second colloid layer 33 is formed on the other surface of the foam body 10. The connecting bodies 35 extend through the through holes 11 of the foam body 10 to interconnect the first and second colloid layers (31, 33).

The foam body 10 has a thickness of about 0.1 mm to about 2 mm.

The through holes 11 may be circular, triangular, square in shape or other geometric shape. In the embodiment, the through holes 11 are uniformly defined and arranged in the foam body 10.

As previously mentioned, the colloid body 30 includes a first colloid layer 31, a second colloid layer 33 and a plurality of connecting bodies 35. The first colloid layer 31 is formed on the first surface 13. The second colloid layer 33 is formed on the second surface 15. The connecting bodies 35 extend through the through holes 11, and integrally connect the first colloid layer 31 and the second colloid layer 33. In the embodiment, the connecting bodies 35 are uniformly arranged in the foam body 10 to improve the rigidity of the foam body 10. The first colloid layer 31 and the second colloid layer 33 may be made of the same material or different materials.

A method for manufacturing the foam assembly 100 may includes at least the following steps:

A foam body 10 is provided. The foam body 10 defines a plurality of through holes 11. The through holes 11 are formed by cutting the foam body 10 using a hob. In the embodiment, the through holes 11 are uniformly dispersed in the foam body 10.

Figure 3:
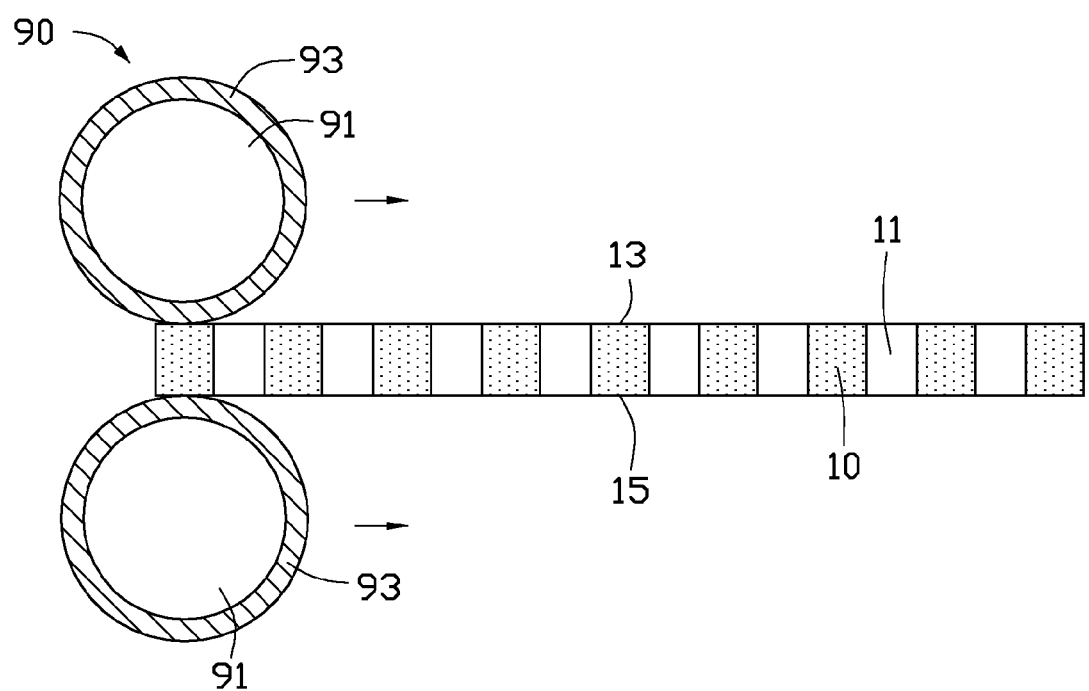
FIG. 3 is a schematic view of an embodiment of a roller used to make the foam assembly in FIG. 2.

Referring to FIG. 3, a colloid coating device 90 is provided. The device 90 includes two opposing rollers 91. The outer surface of each roller 91 is covered with a glue 93 or glues 93 to form the first colloid layer 31 and the second colloid layer 33 on the foam body 10. The glue 93 on each roller 91 may be made of the same material or different materials.

The foam body 10 is positioned between the two rollers 91 and the coating device 90 is turned on. The rollers 91 are moved from one end of the foam body 10 towards to the opposing end of the foam body 10, as indicated by the arrow in FIG. 3. The glue 93 on each roller 91 is coated onto the first surface 13 and the second surface 15. Simultaneously, some of the glue 93 flows into and fills the through holes 11.

The glue 93 solidifies on and in the foam body 10 to form the colloid body 30.

Then, the foam body 10 is cut to form a desired structure of the foam assembly 100.

Figure 4:
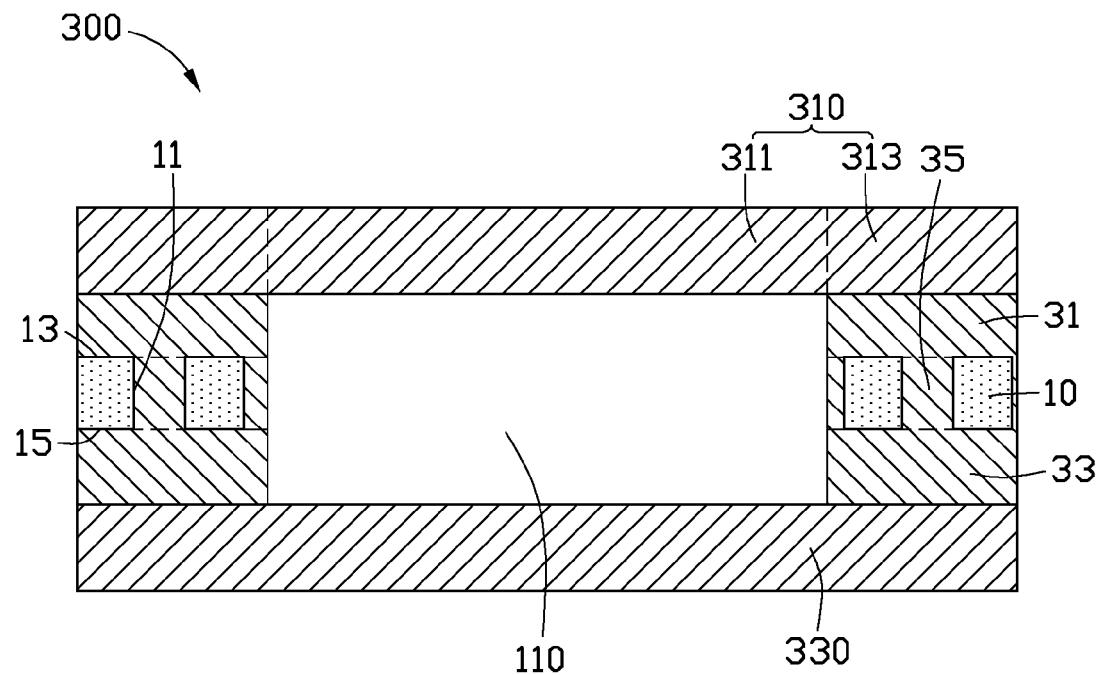
FIG. 4 is a cross-sectional view of an embodiment of an electronic device housing with the foam assembly in place.

Referring to FIG. 4, an electronic device 300 using the foam assembly 100 includes a window assembly 310, a housing 330, and a foam assembly 100 mounted between the window assembly 310 and the housing 330.

The foam assembly 100 defines an opening 110. The window assembly 310 includes a window portion 311 and a window border 313. The opening 110 corresponds to the window portion 311. The window border 313 corresponds to the foam assembly 100 and directly covers the foam assembly 100.

According to the disclosure, the first colloid layer 31 and the second colloid layer 33 are connected by the connecting body 35, which acts to maintain the foam assembly 100 in one piece, and reduce damage, when the foam assembly 100 is completely removed from the electronic device 300, thus improving the recycling rate of the window assembly 310 and the housing 330. The connecting bodies 35 improve the rigidity of the foam body 10 and decrease the thickness of the foam assembly 100, and avoid any problems with shifting or sliding of the adhesive element when the foam assembly 100 is cut to form a desired structure. The handleability of the foam assembly 100 is improved.

It is to be understood, however, that even through numerous characteristics and advantages of the exemplary disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A method for manufacturing a foam assembly comprising:
   providing a foam body, the foam body defining a plurality of through holes;
   providing a colloid coating device, the device comprising two opposing rollers, outer surface of the rollers being covered with glue;
   positioning the foam body between the two rollers;
   causing the rollers to move from one end of the foam body towards to the opposing end of the foam body so that the glue is coated onto two opposing surfaces of the foam body, some of the glue flowing into and filling in the through holes;
   solidifying the glue to form a colloid body on and in the foam body, the colloid body having portions formed on the two opposing surfaces of the foam body and extending through the through holes from one opposing surface of the foam body to the other.

2. The method as claimed in claim 1, wherein the through holes are formed by cutting the foam body using a hob.

* * * * *